United States Patent
Yamane et al.

(10) Patent No.: US 10,304,996 B2
(45) Date of Patent: May 28, 2019

(54) SEMICONDUCTOR LIGHT-EMITTING APPARATUS HAVING WAVELENGTH-CONVERTING STRUCTURE WITH UNEVEN TOP SURFACE AND ITS MANUFACTURING METHOD

(71) Applicant: STANLEY ELECTRIC CO., LTD., Meguro-ku, Tokyo (JP)

(72) Inventors: Takayoshi Yamane, Yokohama (JP); Hiroshi Kotani, Setagaya (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 11 days.

(21) Appl. No.: 15/817,548

(22) Filed: Nov. 20, 2017

(65) Prior Publication Data
US 2018/0158989 A1      Jun. 7, 2018

(30) Foreign Application Priority Data
Nov. 25, 2016 (JP) .................. 2016-228569

(51) Int. Cl.
  *H01L 33/24*       (2010.01)
  *H01L 33/50*       (2010.01)
  *G02F 1/00*        (2006.01)
  *G03F 7/09*        (2006.01)
  *H01L 33/46*       (2010.01)

(52) U.S. Cl.
  CPC ............ *H01L 33/24* (2013.01); *G02F 1/0063* (2013.01); *G03F 7/091* (2013.01); *H01L 33/46* (2013.01); *H01L 33/505* (2013.01); *H01L 33/507* (2013.01)

(58) Field of Classification Search
  CPC .............. H01L 2924/181; H01L 33/60; H01L 2924/12041; H01L 2924/0665; H01L 2933/0041; H01L 33/502; H01L 33/56; H01L 33/50; H01L 33/52; H01L 33/508; H01L 33/505; H01L 33/38; H01L 2933/0091
  USPC ......................................... 313/501
  See application file for complete search history.

(56) References Cited

U.S. PATENT DOCUMENTS

| | | | |
|---|---|---|---|
| 2012/0261688 A1* | 10/2012 | Raukas | H01L 33/505 257/98 |
| 2015/0204494 A1 | 7/2015 | Wada et al. | |
| 2017/0033267 A1* | 2/2017 | Tamaki | H01L 33/502 |

* cited by examiner

*Primary Examiner* — Roy K Potter
(74) *Attorney, Agent, or Firm* — Holtz, Holtz & Volek PC

(57) ABSTRACT

A semiconductor light-emitting apparatus is constructed by a substrate; a semiconductor light-emitting element mounted on the substrate; a wavelength-converting structure, provided on the semiconductor light-emitting element, at least an outer edge portion of the wavelength-converting structure having an uneven top surface; and a white-light reflective layer provided on the substrate to surround sidewalls of the semiconductor light-emitting element and the wavelength-converting structure. The white-light reflective layer further includes an additional transparent resin layer excluding the reflective fillers on at least the outer edge portion of the wavelength-converting structure. The additional transparent resin layer is coupled to the transparent resin layer.

14 Claims, 9 Drawing Sheets

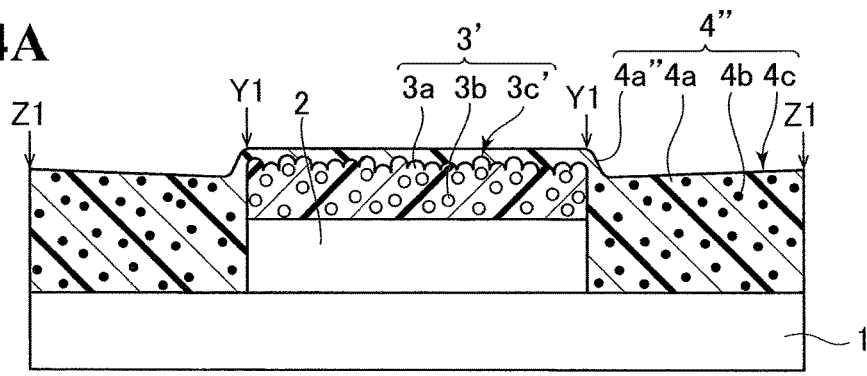
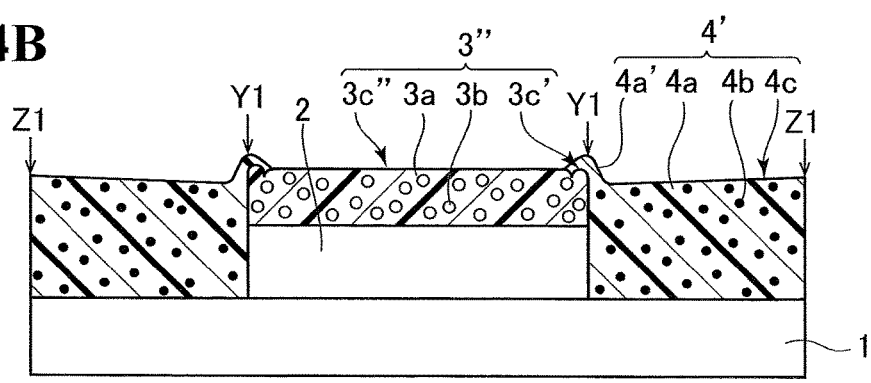
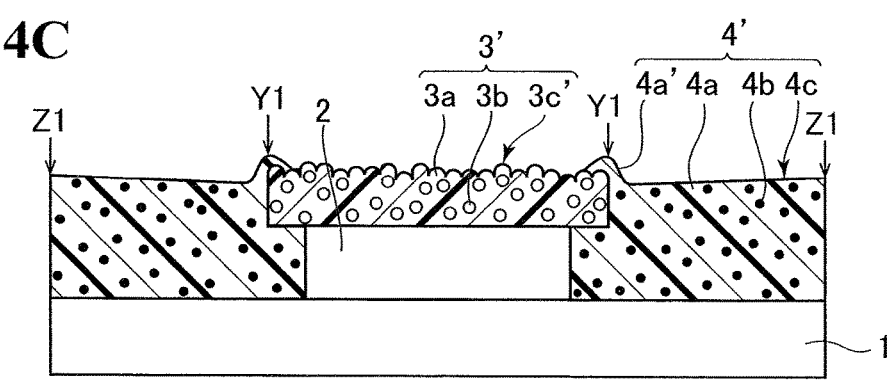
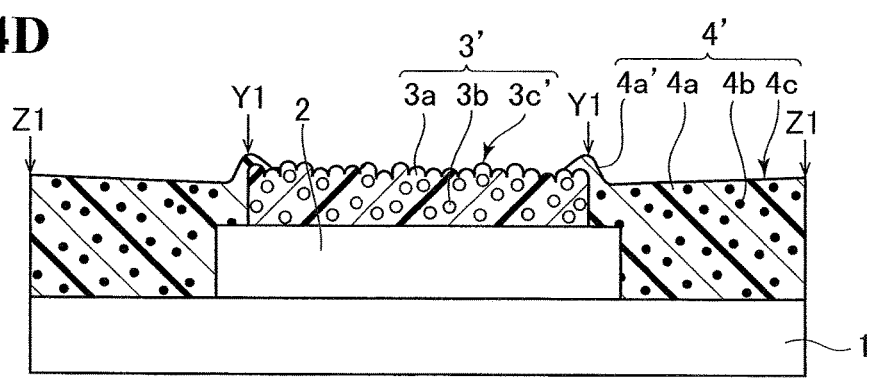

SEMICONDUCTOR LIGHT-EMITTING APPARATUS HAVING WAVELENGTH-CONVERTING STRUCTURE WITH UNEVEN TOP SURFACE AND ITS MANUFACTURING METHOD

This application claims the priority benefit under 35 U.S.C. § 119 to Japanese Patent Application No. JP2016-228569 filed on Nov. 25, 2016, which disclosure is hereby incorporated in its entirety by reference.

BACKGROUND

Field

The presently disclosed subject matter relates to a semiconductor light-emitting apparatus such as a white-light light-emitting diode (LED) apparatus and its manufacturing method.

Description of the Related Art

Generally, a semiconductor light-emitting apparatus is used as an illumination apparatus such as a vehicle head lamp, a vehicle backup lamp, a street lamp, a backlight unit for a liquid crystal display (LCD) unit and a lighting unit. This semiconductor light-emitting apparatus is constructed by a semiconductor light-emitting element such as a light-emitting diode (LED) element or a laser diode (LD) element and a wavelength-converting structure such as a phosphor plate or a phosphor layer including phosphor particles for converting a part of light emitted by the semiconductor light-emitting element into wavelength-converted light with a longer wavelength than that of the emitted light of the semiconductor light-emitting element, thereby mixing light directly emitted from the semiconductor light-emitting element with the wavelength-converted light into desired light such as white light.

In FIG. 8, which illustrates a prior art white-light LED apparatus (see: FIG. 4 of US 2015/0204494 A1), a flip-chip type blue-light LED element 2 is face-down mounted on a substrate 1 such as a wiring printed substrate via metal bumps (not shown) using adhesive material such as AuSn or solder. Also, provided on the blue-light LED element 2 is a plane phosphor plate 3 mounted by transparent adhesives (not shown). The phosphor plate 3 includes a transparent resin layer 3a made of silicone resin or epoxy resin and phosphor particles 3b made of yellow phosphor such as $Y_3Al_5O_{12}:Ce^{+3}$ (YAG) dispersed in the transparent resin layer 3a for converting blue light to yellow light, and has a flat top surface 3c. Further, a white-light reflective layer 4 is provided in order to confine the light emitted from the blue-light LED element 2 within the phosphor plate 3. The white-light reflective layer 4 includes a transparent resin layer 4a made of silicone resin or epoxy resin and reflective fillers 4b made of titanium dioxide ($TiO_2$) or zinc oxide (ZnO) dispersed in the transparent resin layer 4a, and has a flat top surface 4c.

In FIG. 8, the flat top surface 4c of the uncured white-light reflective layer 4 is sufficiently lower than the flat top surface 3c of the phosphor plate 3 by a depth D0 which is tens of µm such as 50 µm. Therefore, since the surface tension and capillary phenomena of the uncured white-light reflective layer 4 toward the flat top surface 3c are weak, the uncured white-light reflective layer 4 including the reflective fillers 4b cannot crawl on the phosphor plate 3. Thus, the reduction of the light extracting efficiency of the phosphor plate 3 by the reflective fillers 4b of the cured white-light reflective layer 4 can be suppressed.

In FIG. 8, however, since the cured white-light reflective layer 4 surrounds only the side surfaces (sidewalls) of the blue-light LED element 2 and the phosphor plate 3, the supporting strength of the phosphor plate 3 by the cured white-light reflective layer 4 is small and the interface between the phosphor plate 3 and the cured white-light reflective layer 4 is exposed to the air. Therefore, if the white-light LED apparatus of FIG. 8 is used for a long time and, also, the switching ON and OFF of the white-light LED apparatus of FIG. 8 is repeated, strain would accumulate in the blue-light LED element 2, the phosphor plate 3 and the cured white-light reflective layer 4 due to the differences in thermal expansion coefficient therein, and also, moisture would penetrate into the interface between phosphor plate 3 and the white-light reflective layer 4. As a result, as indicated by X in FIG. 9, the white-light reflective layer 4 would be peeled from the phosphor plate 3 and the blue-light LED element 2. Thus, the confinement of light within the phosphor plate 3 would be incomplete, so that the light extracting efficiency of the phosphor plate 3 of FIG. 8 would be reduced, and also, the life-time of the white-light LED apparatus of FIG. 8 would be reduced.

SUMMARY

The presently disclosed subject matter seeks to solve the above-described problems.

According to the presently disclosed subject matter, a semiconductor light-emitting apparatus is constructed by a substrate; a semiconductor light-emitting element mounted on the substrate; a wavelength-converting structure, provided on the semiconductor light-emitting element, at least an outer edge portion of the wavelength-converting structure having an uneven top surface; and a white-light reflective layer provided on the substrate to surround sidewalls of the semiconductor light-emitting element and the wavelength-converting structure. The white-light reflective layer further includes an additional transparent resin layer excluding the reflective fillers on at least the outer edge portion of the wavelength-converting structure. The additional transparent resin layer is coupled to the transparent resin layer.

Also, in a method for manufacturing the above-mentioned semiconductor light-emitting apparatus, a semiconductor light-emitting element is mounted on a substrate. Then, a wavelength-converting structure is adhered onto the semiconductor light-emitting element. In this case, at least an outer edge portion of the wave-length-converting structure has an uneven top surface. Then, a white-light reflective layer is coated on the substrate to surround sidewalls of the semiconductor light-emitting element and the wavelength-converting structure. In this case, the white-light reflective layer includes a transparent resin layer and reflective fillers dispersed in the transparent resin layer. Then, surface tension and capillary phenomena are applied upon the white-light reflective layer so that only the transparent resin layer excluding the reflective fillers crawls on at least the outer edge portion of the wavelength-converting structure. Finally, the white-light reflective layer is thermoset after the surface tension and capillary phenomena are applied.

According to the presently disclosed subject matter, since the outer edge portion of the wavelength-converting structure is supported by the additional transparent resin layer of the white-light reflective layer, the supporting strength of the wavelength-converting structure by the white-light reflective layer can be increased. On the other hand, since the wavelength-converting structure is not covered by the reflective fillers of the white-light reflective layer, the reduction of the light extracting efficiency of the wavelength-converting structure can be suppressed.

BRIEF DESCRIPTION OF THE DRAWINGS

The above and other advantages and features of the presently disclosed subject matter will be more apparent from the following description of certain embodiments, as compared with the prior art, taken in conjunction with the accompanying drawings, wherein:

FIG. 4A is a cross-sectional view illustrating a first modification of the white-light LED apparatus of FIG. 1;

FIG. 4B is a cross-sectional view illustrating a second modification of the white-light LED apparatus of FIG. 1;

FIG. 4C is a cross-sectional view illustrating a third modification of the white-light LED apparatus of FIG. 1;

FIG. 4D is a cross-sectional view illustrating a fourth modification of the white-light LED apparatus of FIG. 1;

DETAILED DESCRIPTION OF EXEMPLARY EMBODIMENTS

Figure 1:
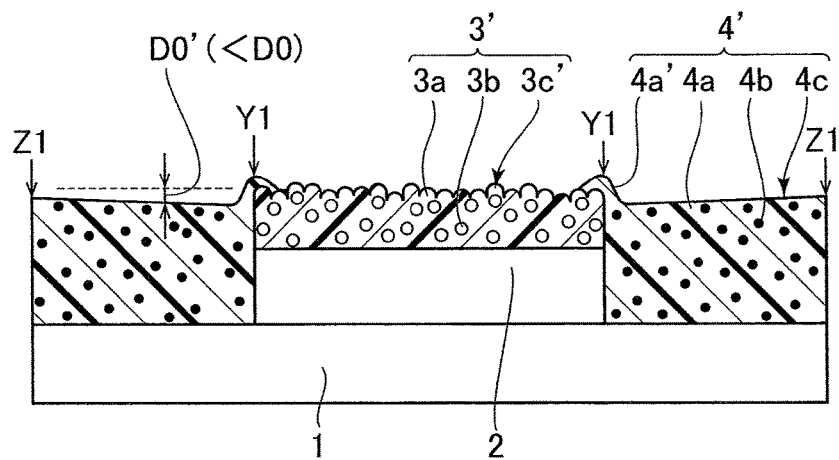
FIG. 1 is a cross-sectional view illustrating a first embodiment of the white-light LED apparatus according to the presently disclosed subject matter.
Figure 8:
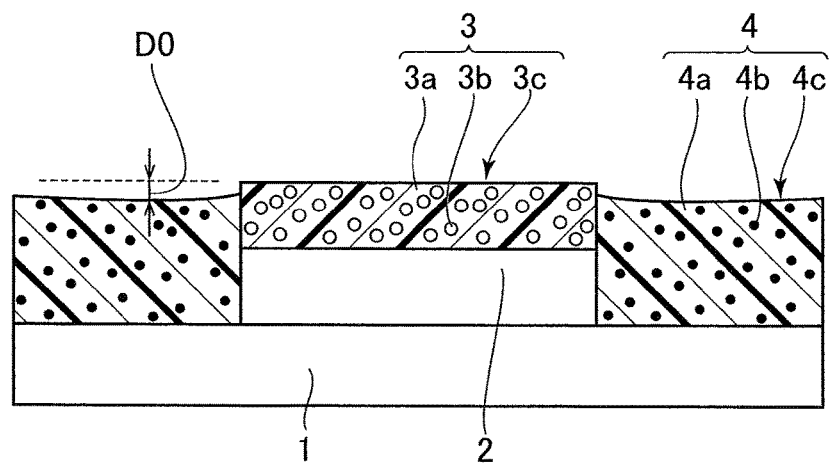
FIG. 8 is a cross-sectional view illustrating a prior art white-light LED apparatus.
Figure 9:
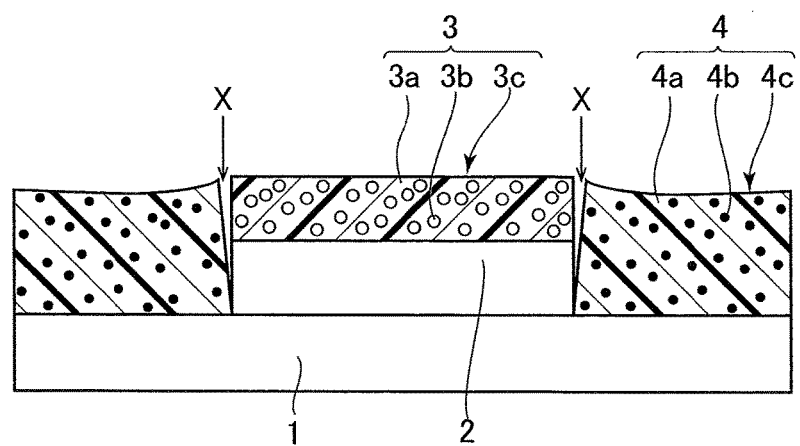
FIG. 9 is a cross-sectional view for explaining the problem in the white-light LED apparatus of FIG. 8.

In FIG. 1, which is a cross-sectional view illustrating a first embodiment of the white-light LED apparatus according to the presently disclosed subject matter, the phosphor plate 3 of FIG. 8 is replaced by a phosphor plate 3' having an uneven top surface 3c', and the white-light reflective layer 4 of FIG. 8 is replaced by a white-light reflective layer 4' which has an additional transparent resin layer 4a' to the white-light reflective layer 4 of FIG. 8. The additional transparent resin layer 4a' excluding the reflective fillers 4b is provided by crawling the transparent resin layer 4a on an outer edge of the uneven top surface 3c' of the phosphor plate 3' as indicated by Y1. Therefore, the additional transparent resin layer 4a' is coupled to the transparent resin layer 4a. Thus, the supporting strength of the phosphor plate 3' by the white-light reflective layer 4' can be remarkably increased.

The surface roughness Rz of the uneven top surface 3c' of the phosphor plate 3' is provided to enhance the surface tension and capillary phenomena of the uncured transparent resin layer 4a, while the surface roughness Rz of the uneven top surface 3c' is provided to suppress the spread of the reflective fillers 4b from the uncured white-light reflective layer 4'. For example, the maximum value of the surface roughness Rz is 10 μm in view of the roughing processes, while the minimum value of the surface roughness Rz is the diameter of the reflective fillers 4b of the white-light reflective layer 4' which diameter is about 0.2 to 0.3 μm. Therefore, the reflective fillers 4b cannot pass through the gaps of the uneven top surface 3c', so that only the uncured transparent resin layer 4a excluding the reflective fillers 4b can crawl on the uneven top surface 3c' due to the enhanced surface tension and capillary phenomena. As a result, the additional transparent resin layer 4a' is formed on the outer edge Y1 of the uneven top surface 3c' of the transparent resin layer 3'.

In more detail, while the flat top surface 4c of the white-light reflective layer 4' is lowered from the uneven top surface 3c' of the phosphor plate 3' by a depth D0' such as 40 μm which is a little smaller than the depth D0 of FIG. 8, the flat top surface 4c of the uncured white-light reflective layer 4' immediately adjacent to the phosphor plate 3' is only several μm (see: D1 in FIG. 2C) due to the surface tension and capillary phenomena. Therefore, only the transparent resin layer 4a of the uncured white-light reflective layer 4' can easily crawl on the outer edge of the uneven top surface 3c' of the phosphor plate 3' due to the enhanced surface tension and capillary phenomena. Thus, the additional transparent resin layer 4a' is formed. On the other hand, crawling of the reflective fillers 4b on the uneven top surface 3c' of the phosphor plate 3' can be suppressed by the gaps of the uneven top surface 3c' to suppress the reduction of the light extracting efficiency of the phosphor plate 3'.

In FIG. 1, note that Z1 indicates a cut face.

The method for manufacturing the semiconductor light-emitting apparatus of FIG. 1 will now be explained with reference to FIGS. 2A, 2B, 2C and 2D.

Figure 2A:
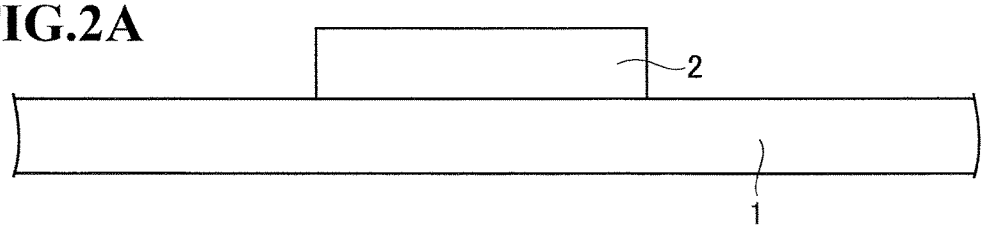
FIGS. 2A, 2B, 2C and 2D are cross-sectional views for explaining a method for manufacturing the white-light LED apparatus of FIG. 1.

First, referring to FIG. 2A for explaining an LED element mounting process, a flip-chip type blue-light LED element 2 is face-down mounted on a substrate 1 via metal bumps (not shown) using adhesive material such as AuSn or solder.

Figure 2B:
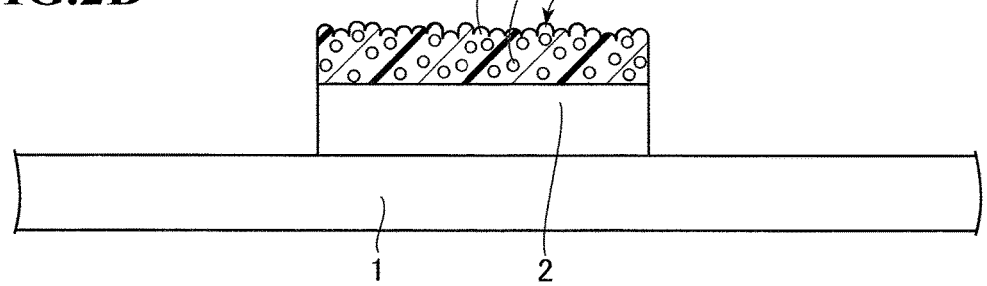

Next, referring to FIG. 2B for explaining a phosphor plate adhering process, a phosphor plate 3' is adhered onto the blue-light LED element 2 by transparent adhesives (not shown). In this case, the top surface of the phosphor plate 3' is roughened by a shot blasting process, a dry etching process or a wet etching process in advance, so that an uneven top surface 3c' is formed on the phosphor plate 3' in advance.

Figure 2C:
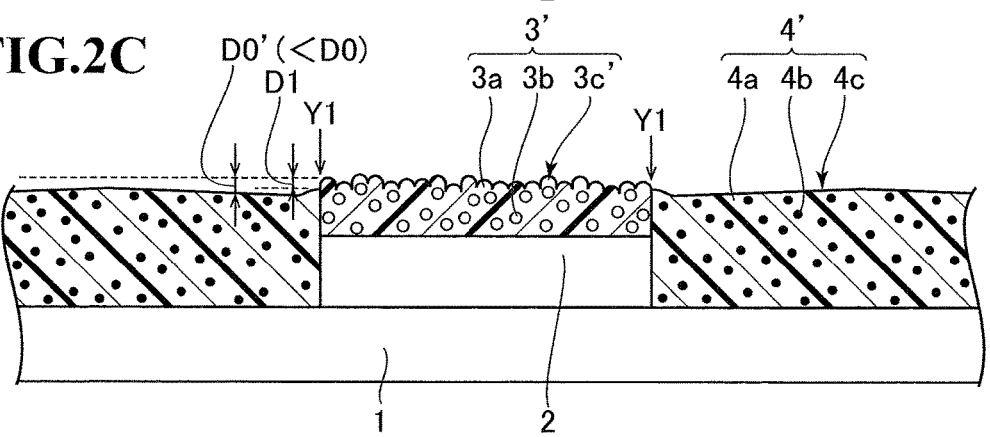

Next, referring to FIG. 2C for explaining a white-light reflective layer coating process, a white-light reflective layer 4' is potted on the substrate 1 to surround the sidewalls of the blue-light LED element 2 and the phosphor plate 3'. In this case, while the depth D0' of the white-light reflective layer 4' relative to the phosphor plate 3' is about 40 μm (<D0), the depth D1 of the white-light reflective layer 4' immediately adjacent to the phosphor plate 3' as indicated by Y1 is several g m due to the surface tension and capillary phenomena of the white-light reflective layer 4'.

Figure 2D:
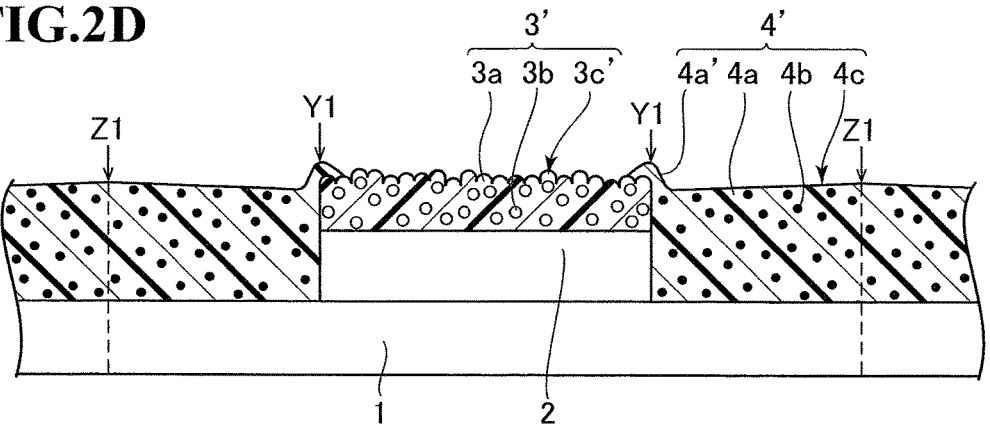

Next, referring to FIG. 2D for explaining a surface tension and capillary phenomena applying process, the apparatus of FIG. 2C is left alone at room temperature without heating it for a predetermined time period such as several minutes, thus positively applying surface tension and capillary phenomena upon the uncured transparent resin layer 4a using the uneven top surface 3c' of the phosphor plate 3'. In this case, the uncured transparent resin layer 4a can easily crawl on the outer edge of the phosphor plate 3' as indicated by Y1 in FIG. 2D; however, the reflective fillers 4b can be prevented from crawling on the phosphor plate 3' by the gaps of the uneven top surface 3c'.

Next, in a thermosetting process, the apparatus of FIG. 2D is put in a furnace to heat it to about 150° C. for about 4 hours depending upon the transparent resin layer 4a and the additional transparent resin layer 4a'. In this case, at an intermediate temperature such as 50° C. to 80° C., the viscosity of the transparent resin layer 4a and the additional transparent resin layer 4a' is temporarily lowered to enhance the crawling speed of the transparent resin layer 4a and the additional transparent resin layer 4a'. Therefore, the thermosetting time period in the surface tension and capillary phenomena process should be determined in view of the crawling speed of the transparent resin layer 4a and the additional transparent resin layer 4a' at the intermediate temperature such as 50° C. to 80° C.

Finally, in an apparatus cutting process, the apparatus of FIG. 2D is cut by using a blade or the like indicated by Z1 in FIG. 2D, thus obtaining the white-light LED apparatus of FIG. 1.

Figure 3:
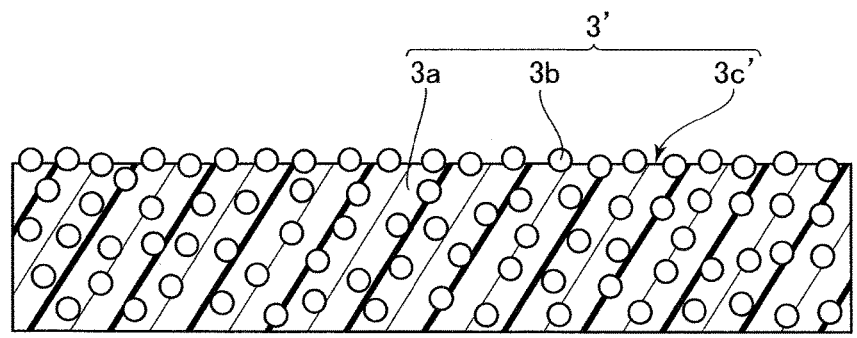
FIG. 3 is across-sectional view illustrating a modification of the phosphor plate of FIG. 1.

In FIG. 3, which illustrates a modification of the phosphor plate 3' of FIG. 1, the phosphor particles 3b are partly extruded from the top surface of the transparent resin layer 3a. In this case, the diameter of phosphor particles 3b is larger than that of the reflective fillers 4b, so that an uneven top surface 3c' is formed by the extruded ones of the phosphor particles 3b from the surface of the transparent resin layer 3a. Also, in this case, in the phosphor plate adhering process as illustrated in FIG. 2B, the shot blasting process, the dry etching process or the wet etching process is unnecessary.

In FIG. 4A, which illustrates a first modification of the white-light LED apparatus of FIG. 1, the white-light reflective layer 4' of FIG. 1 is replaced by a white-light reflective layer 4" which has an additional transparent resin layer 4a" instead of the additional transparent resin layer 4a' of FIG. 1. The additional transparent resin layer 4a" excluding the reflective fillers 4b crawls on the entirety of the uneven top surface 3c' of the phosphor plate 3'. Thus, the supporting strength of the phosphor plate 3' by the white-light reflective layer 4' can further be increased, while the light extracting efficiency of the phosphor plate 3' is hardly decreased due to the additional transparent resin layer 4a".

In the method for manufacturing the semiconductor light-emitting apparatus of FIG. 4A, in the above-mentioned surface tension and capillary phenomena process as illustrated in FIG. 2C, the white-light LED apparatus is left alone for a longer time period such as 2 hours than that of FIG. 2C.

In FIG. 4B, which illustrates a second modification of the white-light LED apparatus of FIG. 1, the phosphor plate 3' of FIG. 1 is replaced by a phosphor plate 3" in which a central area of the uneven top surface 3c' of FIG. 1 except for the outer edge is flattened as indicated by 3c". Therefore, since the surface tension and capillary phenomena at the flat surface 3c" is weak, the crawled uncured transparent resin layer 4a' can be surely limited on the outer edge of the phosphor plate 3'. As a result, the reduction of the light extracting efficiency of the phosphor plate 3" can be suppressed as compared with the phosphor plate 3' of FIG. 1.

In the method for manufacturing the white-light LED apparatus of FIG. 4B, a flat phosphor plate is roughened by a shot blasting process, a dry etching processor a wet etching process, so that an uneven top surface is formed on the entire top phosphor plate. Then, a central area except for the outer edge portion Y1 serving as the uneven top surface 3c' is flattened by a chemical mechanical polishing (CMP) process, so that the flat top surface 3c" is formed.

In FIG. 4C, which illustrates a third modification of the white-light LED apparatus of FIG. 1, the phosphor plate 3' is larger than the blue-light LED element 2 viewed from the top. Thus, the optical loss of the blue-light LED element 2 can be reduced.

In FIG. 4D, which illustrates a third modification of the white-light LED apparatus of FIG. 1, the phosphor plate 3' is smaller than the blue-light LED element 2 viewed from the top. Thus, the light mixing effect can be enhanced to reduce the color tone.

Figure 5:
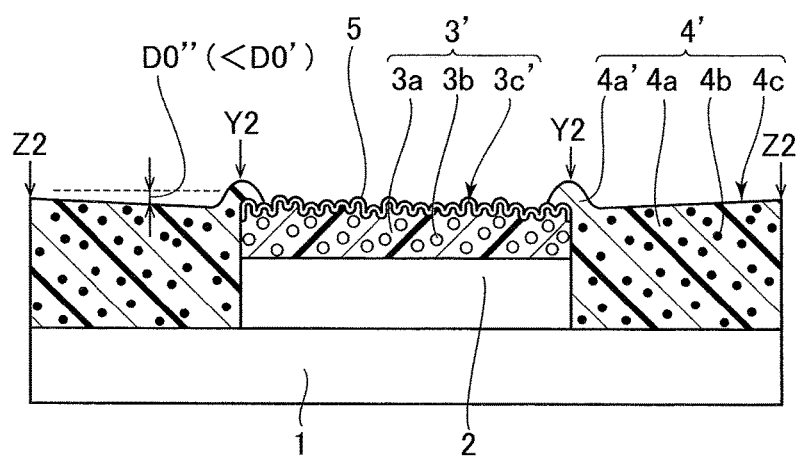
FIG. 5 is a cross-sectional view illustrating a second embodiment of the white-light LED apparatus according to the presently disclosed subject matter.

In FIG. 5, which is a cross-sectional view illustrating a second embodiment of the white-light LED apparatus according to the presently disclosed subject matter, a transparent coating layer 5 is added on the phosphor plate 3' of the white-light LED apparatus of FIG. 1. The transparent coating layer 5 is made of material such as fluororesin for repelling the transparent resin layer 4a made of silicone resin or epoxy resin. Since the transparent coating layer 5 is very thin, i. e., several tens of nm to several μm, the top surface of the transparent coating layer 5 has the same uneven top surface as the uneven top surface 3c' of the phosphor plate 3'.

In FIG. 5, since the transparent coating layer 5 is provided to repel the transparent resin layer 4a' of the white-light reflective layer 4', the white-light reflective layer 4' can be thicken, so that the depth D0" such as 30 μm between the top surface 4c of the white-light reflective layer 4' and the uneven top surface 3c' of the phosphor plate 3' (the top surface of the transparent coating layer 5) can be smaller than the depth D0' in FIG. 1. Even in this case, the additional transparent resin layer 4a' can crawl on the outer edge Y2 of the transparent coating layer 5. Thus, the light confinement effect of the phosphor plate 3' by the white-light reflective layer 4' can be enhanced.

In FIG. 5, note Z2 indicates a cut face.

The method for manufacturing the semiconductor light-emitting apparatus of FIG. 5 will now be explained with reference to FIGS. 6A, 6B, 6C and 6D.

Figure 6A:
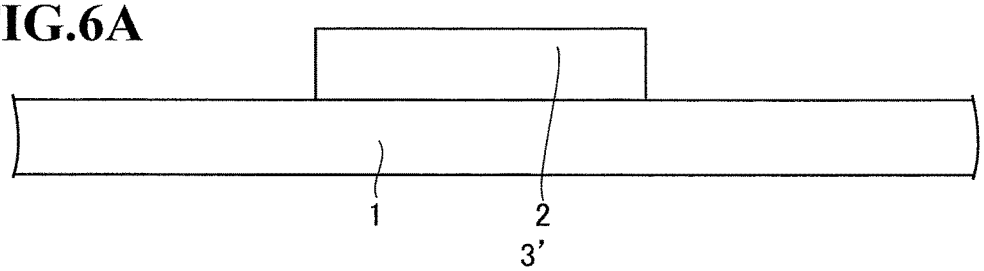
FIGS. 6A, 6B, 6C and 6D are cross-sectional views for explaining a method for manufacturing the white-light LED apparatus of FIG. 5.

First, referring to FIG. 6A for explaining an LED element mounting process, in the same way as in FIG. 2A, a flip-chip type blue-light LED element 2 is face-down mounted on a substrate 1 via metal bumps (not shown) using adhesive material such as AuSn or solder.

Figure 6B:
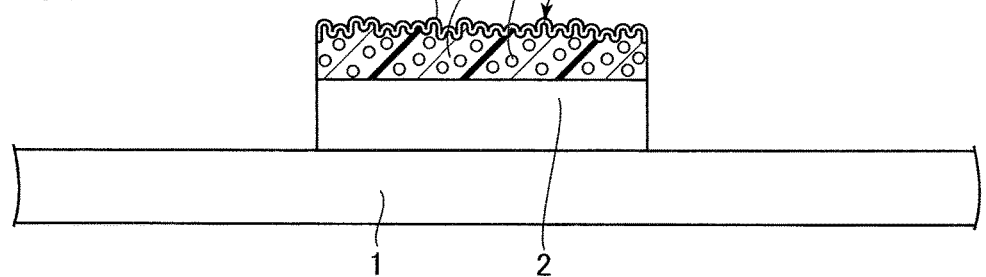

Next, referring to FIG. 6B for explaining a phosphor plate adhering process, a phosphor plate 3' along with a transparent coating layer 5 is adhered onto the blue-light LED element 2 by transparent adhesives (not shown). In this case, the top surface of the phosphor plate 3' is roughened by a shot blasting process, a dry etching process or a wet etching process in advance, so that an uneven top surface 3c' is formed on the phosphor plate 3' in advance. Further, a fluororesin layer is coated on the uneven top surface 3c' of the phosphor plate 3' in advance, to form the transparent coating layer 5. Note that the transparent coating layer 5 can be coated after the phosphor plate 3' is adhered onto the blue-light LED element 2.

Figure 6C:
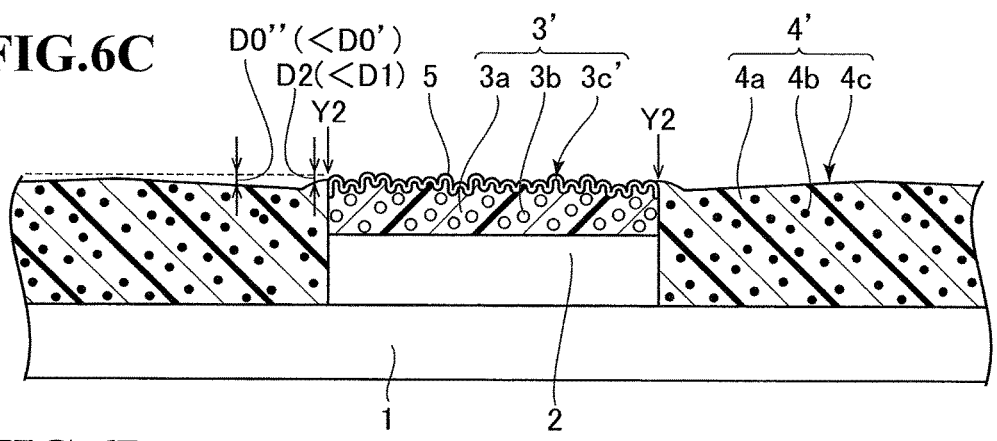

Next, referring to FIG. 6C for explaining a white-light reflective layer coating process, a white-light reflective layer 4' is potted on the substrate 1 to surround the sidewalls of the blue-light LED element 2 and the phosphor plate 3'. In this case, since the transparent coating layer 5 is provided to repel the transparent resin layer 4a, the depth D0" such as 30 μm of the white-light reflective layer 4' relative to the phosphor plate 3' can be smaller than the depth D0' of FIG. 2C, the depth D2 of the white-light reflective layer 4' immediately adjacent to the phosphor plate 3' as indicated by Y2 can be smaller than the depth D1 in FIG. 2C due to the surface tension and capillary phenomena of the white-light reflective layer 4'.

Figure 6D:
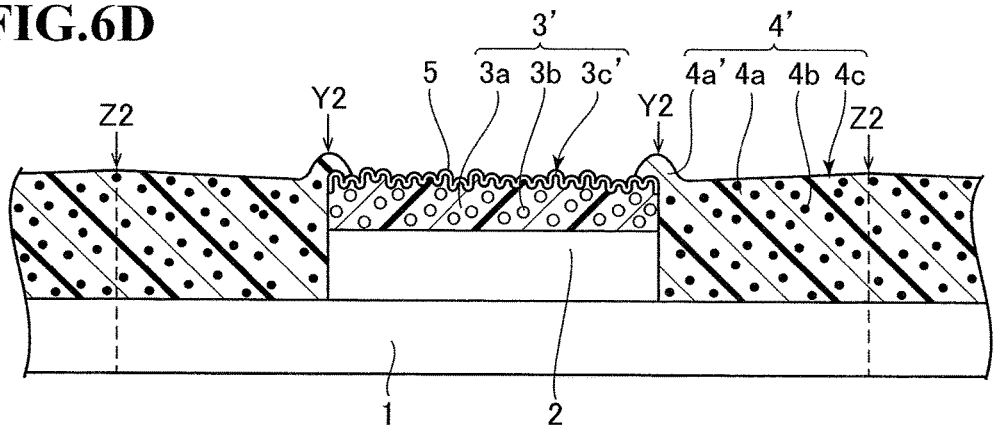

Next, referring to FIG. 6D for explaining a surface tension and capillary phenomena applying process, in the same way as in FIG. 2D, the apparatus of FIG. 6C is left alone at room temperature without heating it for a predetermined time period such as several minutes, thus positively applying surface tension and capillary phenomena upon the uncured transparent resin layer 4a using the uneven top surface 3c' of the phosphor plate 3'. In this case, the uncured transparent resin layer 4a can easily crawl on the outer edge of the transparent coating layer 5 as indicated by Y2 in FIG. 6D; however, the reflective fillers 4b can be prevented from crawling on the transparent coating layer 5 by the gaps of the uneven top surface thereof.

Next, in a thermosetting process, the apparatus of FIG. 6D is put in a furnace to heat it to about 150° C. for about 4 hours depending upon the transparent resin layer 4a and the additional transparent resin layer 4a'. In this case, at an intermediate temperature such as 50° C. to 80° C., the viscosity of the transparent resin layer 4a and the additional transparent resin layer 4a' is temporarily lowered to enhance the crawling speed of the transparent resin layer 4a and the additional transparent resin layer 4a'. Therefore, the thermosetting time period in the surface tension and capillary phenomena process should be determined in view of the crawling speed of the transparent resin layer 4a and the additional transparent resin layer 4a' at the intermediate temperature such as 50° C. to 80° C.

Finally, in an apparatus cutting process, the apparatus of FIG. 6D is cut by using a blade or the like indicated by Z2 in FIG. 6D, thus obtaining the white-light LED apparatus of FIG. 5.

Figure 7:
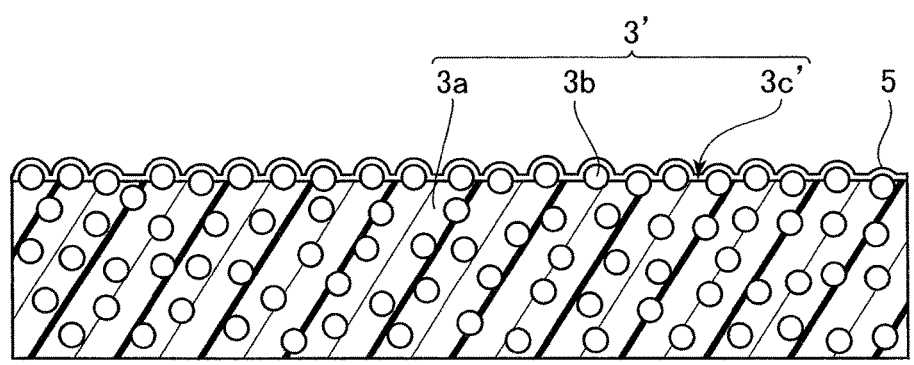
FIG. 7 is a cross-sectional view illustrating a modification of the phosphor plate and the transparent coating layer of FIG. 5.

In FIG. 7, which illustrates a modification of the phosphor plate 3' and the transparent coating layer 5 of FIG. 5, the phosphor particles 3b are partly extruded from the top surface of the transparent resin layer 3a. In this case, the diameter of phosphor particles 3b is larger than that of the reflective fillers 4b, so that an uneven top surface 3c' is formed by the extruded ones of the phosphor particles 3b from the surface of the transparent resin layer 3a. In this case, in the phosphor plate adhering process as illustrated in FIG. 6B, the shot blasting process, the dry etching process or the wet etching process is unnecessary.

Also, the modifications of FIGS. 4A, 4B, 4C and 4D can be applied to the white-light LED apparatus of FIG. 5.

In the above-described embodiments, the phosphor structure is constructed by a phosphor plate; however, the phosphor structure can be constructed by a phosphor layer. In this case, a phosphor layer is coated on a substrate where a blue-light LED element is mounted, and then, the phosphor layer is patterned by a photolithography and etching process, so that the phosphor layer is formed on only the blue-light LED element.

In addition, in the above-described embodiments, a single blue-light LED element 2 is provided on the substrate 1; however, two or more blue-light LED elements can be provided on the substrate 1.

Further, in the above-described embodiments, a blue-light LED element is provided; however, other semiconductor light-emitting elements such as other LED elements or laser diode (LD) elements can be provided.

It will be apparent to those skilled in the art that various modifications and variations can be made in the presently disclosed subject matter without departing from the spirit or scope of the presently disclosed subject matter. Thus, it is intended that the presently disclosed subject matter covers the modifications and variations of the presently disclosed subject matter provided they come within the scope of the appended claims and their equivalents. All related or prior art references described above and in the Background section of the present specification are hereby incorporated in their entirety by reference.

The invention claimed is:

1. A semiconductor light-emitting apparatus comprising:
a substrate;
a semiconductor light-emitting element mounted on said substrate;
a wavelength-converting structure, provided on said semiconductor light-emitting element, at least an outer top surface portion of said wavelength-converting structure having an uneven top surface; and
a white-light reflective layer provided on said substrate to surround sidewalls of said semiconductor light-emitting element and said wavelength-converting structure, said white-light reflective layer comprising transparent resin and reflective fillers dispersed in said transparent resin,
said white-light reflective layer further comprising additional transparent resin provided on at least said outer top surface portion of said wavelength-converting structure, said additional transparent resin excluding said reflective fillers.

2. The semiconductor light emitting apparatus as set forth in claim 1, further comprising a transparent coating layer, provided directly on said wavelength-converting structure, for repelling said transparent resin.

3. The semiconductor light-emitting apparatus as set forth in claim 1, wherein said transparent resin comprises one of silicone resin and epoxy resin.

4. The semiconductor light-emitting apparatus as set forth in claim 2, wherein said transparent coating layer comprises fluororesin.

5. The semiconductor light-emitting apparatus as set forth in claim 1, wherein said wavelength-converting structure comprises one of a phosphor plate and a phosphor layer including phosphor particles.

6. The semiconductor light-emitting apparatus as set forth in claim 5, wherein said phosphor particles has a diameter larger than a diameter of said reflective fillers, said uneven top surface being formed by excluded ones of said phosphor particles from a surface of said wavelength-converting structure.

7. The semiconductor light-emitting apparatus as set forth in claim 1, wherein entirety of said wavelength-converting structure has an uneven top surface, said additional transparent resin being provided on the entirety of said wavelength-converting structure.

8. The semiconductor light-emitting apparatus as set forth in claim 1, wherein a top surface except for said outer top surface portion of said wavelength-converting structure is flat.

9. The semiconductor light-emitting apparatus as set forth in claim 1, wherein said wavelength-converting structure is larger than said semiconductor light-emitting element when viewed from above.

10. The semiconductor light-emitting apparatus as set forth in claim 1, wherein said wavelength-converting structure is smaller than said semiconductor light-emitting element when viewed from above.

11. The semiconductor light-emitting apparatus as set forth in claim 1, wherein a maximum value of surface roughness of said uneven top surface is 10 μm, and a minimum value of surface roughness of said uneven top surface is equal to a diameter of said reflective fillers, and
wherein said diameter of said reflective fillers is from 0.2 µm to 0.3 µm.

12. The semiconductor light-emitting apparatus as set forth in claim 2, wherein a thickness of said transparent coating layer is from several tens of nm to several µm.

13. A method for manufacturing said semiconductor light-emitting apparatus as set forth in claim 1, comprising:
mounting said semiconductor light-emitting element on said substrate;
adhering said wavelength-converting structure onto said semiconductor light-emitting element;
coating said white-light reflective layer on said substrate to surround said sidewalls of said semiconductor light-emitting element and said wavelength-converting structure;
applying a surface tension and capillary phenomena upon said white-light reflective layer so that only said transparent resin excluding said reflective fillers crawls on at least said outer top surface portion of said wavelength-converting structure; and
thermosetting said white-light reflective layer after said surface tension and capillary phenomena are applied.

14. A method for manufacturing said semiconductor light-emitting apparatus as set forth in claim 2, comprising:
mounting said semiconductor light-emitting element on said substrate;
coating said transparent coating layer on said wavelength-converting structure;
adhering said wavelength-converting structure along with said transparent coating layer onto said semiconductor light-emitting element;
coating said white-light reflective layer on said substrate to surround said sidewalls of said semiconductor light-emitting element and said wavelength-converting structure;
applying a surface tension and capillary phenomena upon said white-light reflective layer so that only said transparent resin excluding said reflective fillers crawls on at least an outer top surface portion of said transparent coating layer; and
thermosetting said white-light reflective layer after said surface tension and capillary phenomena are applied.

* * * * *